United States Patent [19]

Turk et al.

[11] Patent Number: 4,654,753
[45] Date of Patent: Mar. 31, 1987

[54] PRINTED CIRCUIT MODULE

[75] Inventors: Wilfried Turk; Herrmann Wessely, both of Munich, Fed. Rep. of Germany

[73] Assignee: Siemens Aktiengesellschaft, Berlin and Munich, Fed. Rep. of Germany

[21] Appl. No.: 847,124

[22] Filed: Mar. 31, 1986

Related U.S. Application Data

[63] Continuation of Ser. No. 640,169, Aug. 13, 1984, abandoned.

[30] Foreign Application Priority Data

Sep. 30, 1983 [DE] Fed. Rep. of Germany ....... 3336615

[51] Int. Cl.$^4$ .......................... H01R 9/00; H05K 7/20
[52] U.S. Cl. .................................. 361/388; 361/400; 339/17 M
[58] Field of Search ................. 339/18 B, 17 C, 17 L, 339/17 LM, 17 M, 220 R, 221 R; 361/400, 404, 405, 412, 413, 386–388

[56] References Cited

U.S. PATENT DOCUMENTS

| | | | |
|---|---|---|---|
| 3,717,841 | 2/1973 | Mancene | 339/17 C |
| 3,955,124 | 5/1976 | Jones | 361/404 |
| 4,362,353 | 12/1982 | Cobaugh | 339/221 R |
| 4,384,757 | 5/1983 | Andrews, Jr. | 339/17 C |
| 4,410,928 | 10/1983 | Aramaki | 361/400 |
| 4,516,188 | 5/1985 | Kessler | 361/400 |

Primary Examiner—G. P. Tolin

[57] ABSTRACT

A printed circuit module comprises a printed circuitboard equipped with integrated modules, a connector part and a contact pressure part exerting a pressure on a printed circuitboard surface, for example, a cooling device. In order to prevent warping or bending of the printed circuitboard due to the contact pressure component or due to plugging and unplugging operations, and from causing line breaks or the like, a counterpressure on the printed circuitboard is generated and a flexible connection is established between the connector part and the printed circuitboard. To this end, contacting elements of the connector part are uniformly, aerially distributed over the printed circuitboard. They respectively comprise a spring shaft for receiving a contact pin and a connecting lug resting against the printed circuitboard in a spring-like manner and whose end adjoining the contact guide surface is designed in the form of a straight metal strip and presses with its end face 3 onto to the contacting surface, and whose other end is connected to the spring shaft via a leaf spring portion bent in a wavy manner.

1 Claim, 1 Drawing Figure

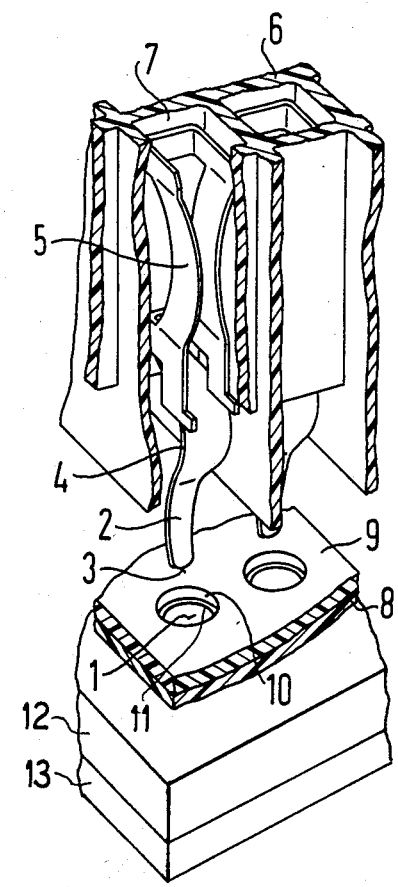

PRINTED CIRCUIT MODULE

This is a continuation, of application Ser. No. 640,169, filed Aug. 13, 1984, and now abandoned.

BACKGROUND OF THE INVENTION

1. Field of the Invention

The present invention relates to a printed circuit module, consisting of a printed circuitboard equipped with electrical modules, a connector part comprising a plurality of contact elements, and a pressure part exerting a pressure on a printed circuitboard surface, for example a cooling device.

2. Description of the Prior Art

In the construction of large electronic systems, such as for example, data processing systems, the object is to obtain signal lines which are as short as possible and having a defined wave resistance, and, hence, obtaining high switching speeds. This can be achieved with the aid of printed circuit modules which exhibit single or multi-layer printed circuitboards having integrated modules and which are connected via electrical conductors to a wiring plate. In order to obtain a high conductor density, the latter is likewise executed in multilayer fashion and contains signal lines for the connection of assemblies with one another, as well as potential lines and apply lines. In the case of printed circuit modules of maximum packing density, the numerous external connections necessary for this purpose are distributed over the narrowest space on the lower side, in order to directly establish the connection to the printed circuitboard.

From the U.S. Pat. No. 3,993,123, a printed circuit module having heat-emitting modules is known which are contacted on one side of the support plate. They are disposed beneath the cooling device which surrounds the modules like a cap from which one or more spring parts press a heat dissipating element on each module. The pressure produced, therefore, is diverted to the plate edges which are flanged onto the cooling device, whereby, however, the support can undergo warping.

Since also a large number of perpendicularly-projecting connectors is mounted on the support plate, a warping impairs the plugging and unplugging of the printed circuit modules which, as is known, requires pins which are precisely aligned relative to one another. On the other hand, the danger exists that pins will become bent or broken and that faulty connections thereby result, or that at least even greater mating and drawing forces need be applied than are necessary anyway because of the large number of connections. Moreover, in the case of the printed circuitboard avoiding mechanical tension, the danger exists that fine cracks will result in the printed circuitboards and interrupt the connections. This can occur or the more readily when the pins are fixedly connected to the printed circuitboard and the already existing deflection during frequent change of the printed circuit module is increased due to tensile or forces, on the one hand, and is again reset due to the flexibility of the printed circuitboard, on the other hand, which can lead to a fatigue of the printed conductor material.

SUMMARY OF THE INVENTION

The object of the present invention, therefore, is to provide a printed circuit module of the type mentioned above which is provided with a connector part, and in such a fashion that error sources resulting from connector operations and to drawing operations are reduced.

According to a prior German application, the above object is achieved in that, on the side of the printed circuitboard, opposite the pressure component, contacting the surfaces are arranged uniformly distributed, that the connector part extends over this entire lateral surface and that it exhibits, above the contacting surfaces, openings for the contact elements which respectively comprise a spring shaft and a connecting lug, designed as a compression spring and resting under spring tension against the contacting surfaces. In this manner, no one-sided pressure forces act on the printed circuitboard so that no warping or bending occurs. Through the selection of the spring constants of the connection lugs, the counterpressure on the printed circuitboard is preadjustable. Since, moreover, the contact elements are not rigidly connected to the printed circuitboard, the forces occurring during plugging and unplugging do not lead to a deflection of the printed circuitboard. Cracks and fractures in printed conductors or in solder connections, which originate from a static or dynamic force action, are thereby prevented.

If the connecting lugs, as illustrated in that German patent application, are designed in the form of U-shaped, curved leaf springs, difficulties can arise in the case of a very large packing density and, hence, very narrowly-disposed contacting surfaces, because of the space requirement for the U-shaped leaf springs. Accordingly, the object of the present invention is to provide a very space-saving, but nevertheless effective, shape for the connecting lugs. In accordance with the invention, this is achieved in that the end of the connecting lug abutting the contacting surface, respectively, is designed in the form of a straight metal strip, that is presses with its end face on the contacting surface, and that the other end is connected, via a leaf spring part bent in a wavy manner, with the spring shaft. It is readily apparent that the space requirement of a connecting lug designed in this manner is substantially less than that of the connecting lug designed in U-shape form in the contact region.

According to a further feature of the invention, on the printed circuitboards supporting the contacting surfaces, a reinforcement plate having holes arranged corresponding to the contacting surface is arranged and the straight metal strip of the connecting lugs press through the hole onto the contacting surfaces.

BRIEF DESCRIPTION OF THE DRAWING

Other objects, features and advantages of the invention, its organization, construction and operation will be best understood from the following detailed description, taken in conjunction with the accompanying drawing, on which there is a single figure which is an exploded fragmentary sectional view of an embodiment of the invention.

DESCRIPTION OF THE PREFERRED EMBODIMENTS

Referring to the drawing, a printed circuitboard 8 has openings 11 revealing contacting surfaces 1. The opposite surfaces engage electric modules 12 which lie against a cooling device 13. A spring housing 6 comprises so-called spring cones 7 in which spring shafts 5 are disposed, the spring shafts 5, as illustrated, essentially comprising three lateral portions which are interconnected in a U-shaped fashion, forming a channel for a contact pin (not illustrated). The two U-legs exhibit curved spring center sections narrowing the receiving channel in a funnel-shaped fashion. Following the shaft 5 is a connecting lug which, according to the present invention, consists of a wavy leaf spring part 4, directly joining the spring shaft, and at its end consist of a straight flat metal strip 2. The latter is so designed and arranged that it presses with its end face 3 on the contacting surface 1. The contact surfaces 1 are therefore pressed against the module 12 which, in turn, is pressed against the cooling device 13.

According to a further feature of the invention, a reinforcement plate 9 comprises holes 10 arranged corresponding to the arrangement of the contacting surfaces 1. The plate 9 has, primarily, the task of reinforcing the printed circuitboard 8, but can, in addition, also serve the purpose of guiding the straight metal strips 2 of the connecting lugs which press through the hole 10 onto the contacting surfaces 1.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. In a printed circuit structure of the type in which at least one electric module engages a cooling device on one side thereof and engages a plurality of contact surfaces of a printed circuitboard on the other side thereof, and in which the contact surfaces are respectively contacted by electrical contacts of an electrical connector which extends over the entire printed circuitboard and which has passages therethrough for the electrical contacts, the improvement wherein:

a reinforcing plate is carried by the printed circuitboard and includes a plurality of holes aligned with the contact surfaces of the printed circuitboard; and each of said electrical contacts comprises a spring sectin for receiving plug pin, a straight flat metal strip including an end face engaging the respective contact surface, and a wave-shaped leaf spring integral therewith and connecting said straight flat metal strip and said spring section, said straight flat metal strips contacting said contact surfaces through said holes of said reinforcing plate.

* * * * *